United States Patent
Nakamura et al.

(10) Patent No.: US 7,179,718 B2
(45) Date of Patent: Feb. 20, 2007

(54) STRUCTURE AND METHOD OF MANUFACTURING THE SAME

(75) Inventors: Takashi Nakamura, Kaisei-machi (JP); Tetsu Miyoshi, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/964,614

(22) Filed: Oct. 15, 2004

(65) Prior Publication Data

US 2005/0082662 A1 Apr. 21, 2005

(30) Foreign Application Priority Data

| Oct. 17, 2003 | (JP) | ............................. 2003-357608 |
| Mar. 26, 2004 | (JP) | ............................. 2004-093221 |

(51) Int. Cl.
*H01L 21/30* (2006.01)

(52) U.S. Cl. ...................... 438/455; 438/458; 438/782; 257/E21.568

(58) Field of Classification Search ........ 438/455–459, 438/765, 782
See application file for complete search history.

(56) References Cited

U.S. PATENT DOCUMENTS

| 5,203,944 A | * | 4/1993 | Prinz et al. ................. 156/247 |
| 6,523,236 B1 | * | 2/2003 | Nishikawa et al. ........... 29/890 |
| 2005/0046312 A1 | * | 3/2005 | Miyoshi .................... 310/366 |

FOREIGN PATENT DOCUMENTS

| JP | 2003-34003 A | 2/2003 |
| JP | 2003-215256 A | 7/2003 |

* cited by examiner

*Primary Examiner*—H. Jey Tsai
(74) *Attorney, Agent, or Firm*—Sughrue Mion, PLLC

(57) ABSTRACT

A method of manufacturing a structure in which a substrate can be removed easily from a structure that has been formed on the substrate by using a film forming technology. The method of manufacturing a structure includes the steps of (a) forming an intermediate layer on a substrate; (b) forming a structure including a brittle material layer on the intermediate layer by at least using a spray deposition method of spraying material powder toward the substrate, on which the intermediate layer is formed, to deposit the material powder; and (c) removing the substrate from the structure.

7 Claims, 9 Drawing Sheets

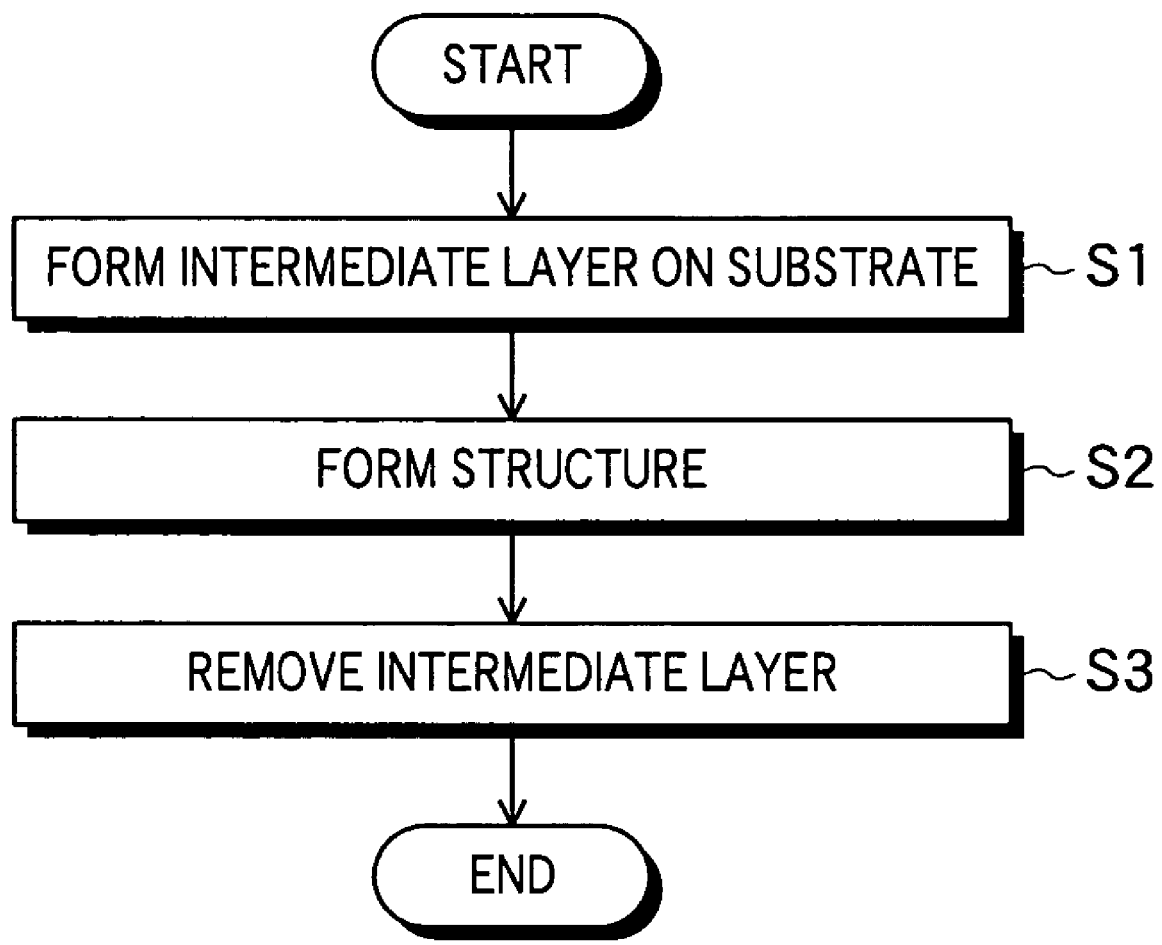

STRUCTURE AND METHOD OF MANUFACTURING THE SAME

BACKGROUND OF THE INVENTION

1. Field of the Invention

The present invention relates to a method of manufacturing a structure by using a film forming technology, and specifically, to a method of manufacturing a structure by using a spray deposition method. Furthermore, the present invention relates to a structure manufactured by using such a manufacturing method.

2. Description of a Related Art

Conventionally, as a technology of forming a thin film or thick film, the sputtering method, sol-gel method, vapor deposition method, thermal spray method, aerosol deposition (AD) method, etc. are known. Among them, especially, the AD method receives attention as a technology that enables forming a strong thick film by employing a hard and brittle material such as ceramic.

The AD method is a method of depositing raw material powder by generating an aerosol containing the raw material powder and spraying it from the nozzle toward a substrate, and also referred to as gas deposition method, spray deposition method, or fine particle beam deposition method. In the AD method, a film is formed by the mechanochemical reaction in which the raw material powder sprayed at high speed impinges on and cuts into an under layer, that is, the substrate or the previously formed under layer of the deposited material, and a crushed surface produced by the crushing of the powder at the time of impingement adheres to the under layer. Therefore, according to the AD method, a dense and strong thick film containing no impurity can be formed. The phenomenon that the raw material powder cuts into the under layer is referred to as "anchoring".

Such AD method is suitable for the case of fabricating a brittle material (hard and brittle material) including ceramic. According to the AD method, a laminated structure including plural material layers such as a multi-layer capacitor can be fabricated easily. Further, a film of PZT (Pb (lead) zirconate titanate) as a kind of ceramic, formed on the substrate by using the AD method is applied as a piezoelectric actuator, a piezoelectric pump, an ink-jet printer head, and an ultrasonic transducer.

In the AD method, since the collision energy generated when the material powder impinges on the under layer is utilized to deposit the material on the under layer, at the time of film formation, generally, a substrate having hardness of some degree such as silicon, glass, sapphire, or SUS (special use steel) is used.

Further, Japanese Patent Application Publication JP-A-2003-34003 discloses a method of forming a brittle material structure on a resin base material without cutting the resin base material. In this method, after a foundation layer of a hard material is formed on the surface of the resin substrate, the brittle material is allowed to impinge on the foundation layer by using the fine particle beam deposition method such that a part of the brittle material cuts into the foundation layer to form an anchor part. Thereby, a polycrystalline brittle structure is formed in which there is substantially no crystalline orientation and no grain boundary made of a glass layer at the boundary of the crystals. According to the method, by using the AD method, a structure can be formed also on a resin substrate.

By the way, since a structure formed on a substrate by using a film forming technology such as the AD method is strongly in close contact with the substrate, it is difficult to separate the substrate therefrom. Accordingly, such a structure is often utilized with a substrate attached thereto. However, it is not negligible that the existence of the substrate causes deterioration of the function of the structure or the device using the structure.

For example, in an ultrasonic transducer fabricated by using the substrate as described above, the propagation efficiency of ultrasonic waves is deteriorated by the substrate. Accordingly, it is conceivable that the substrate is removed from the structure by grinding or the like. However, grinding of the substrate is difficult, and sometimes the structure is damaged by the stress at the time of grinding. On the other hand, in the case of trying to remove the substrate by chemical etching, the film stress concentrated on the boundary between the AD film and the substrate is released and cracking occurs on the back surface of the AD film by the reaction, which results in deterioration in yield. Therefore, a method is desired that enables easy removal of a substrate from a structure.

Furthermore, Japanese Patent Application Publication JP-A-2003-215256 discloses that, in a method of manufacturing a radiation detector assembly, a phosphor layer having a filling factor of 5% to 40% is formed by using the gas deposition method. However, this manufacturing method is objected to make the sensitivity and the sharpness of the radiation detector assembly higher, and the easy removal of the substrate from the structure is not disclosed therein.

SUMMARY OF THE INVENTION

The present invention has been achieved in view of the above-described problems. An object of the present invention is to easily remove a substrate from a structure that has been formed on the substrate by using a film forming technology such as the AD method.

In order to solve the above-described problems, a method of manufacturing a structure according to the present invention includes the steps of: (a) forming an intermediate layer on a substrate; (b) forming a structure including a brittle material layer on the intermediate layer by at least using a spray deposition method of spraying material powder toward the substrate, on which the intermediate layer is formed, to deposit the material powder; and (c) removing the substrate from the structure.

Here, step (a) may include forming the intermediate layer by employing a material containing a polymer that is decomposed by being thermally oxidized, and step (c) may include separating the substrate from the structure by removing at least a part of the intermediate layer by thermally oxidizing the polymer. Alternatively, step (a) may include forming the intermediate layer having a void ratio higher than that of the brittle material layer by spraying material powder toward the substrate to deposit the material powder.

Further, a structure according to the present invention includes: a first ceramic layer having a first void ratio, formed by spraying ceramic powder toward a substrate to deposit the ceramic powder; and a second ceramic layer having a second void ratio lower than the first void ratio, formed by spraying ceramic powder toward the substrate on which the first ceramic layer is formed to deposit the ceramic powder.

According to the present invention, the intermediate layer has been formed on the substrate in advance, the structure is formed by forming a film or films on the intermediate layer, and then, the substrate is removed. Therefore, the substrate can be easily removed from the structure without damaging the structure.

BRIEF DESCRIPTION OF THE DRAWINGS

FIG. 1 is a flowchart showing a method of manufacturing a structure according to the first embodiment of the present invention;

DESCRIPTION OF THE PREFERRED EMBODIMENTS

Figure 2A:
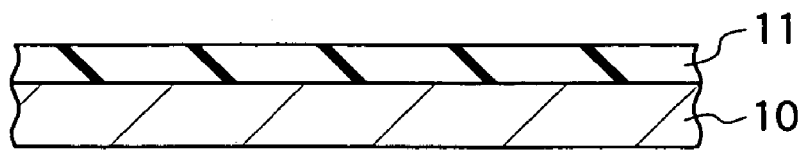
FIGS. 2A–2C are diagrams for explanation of the method of manufacturing a structure according to the first embodiment of the present invention.

Hereinafter, embodiments of the present invention will be described in detail by referring to the drawings. The same component elements are assigned with the same reference numerals and the description thereof will be omitted. Further, a thick film in this application refers to a film having a thickness on the order of one hundred to several hundreds of micrometers.

Figure 2B:
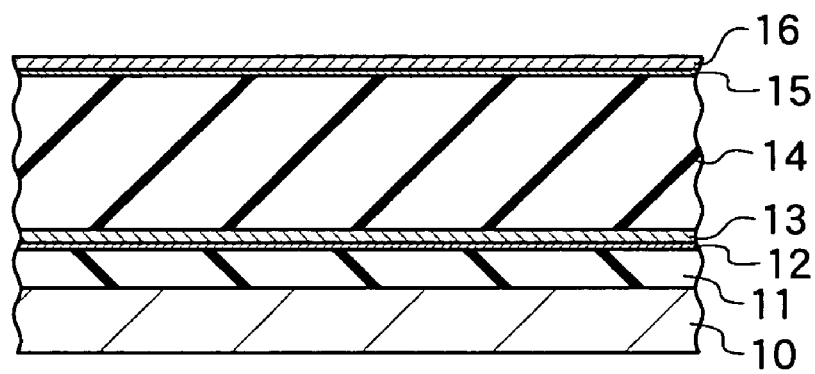
Figure 2C:
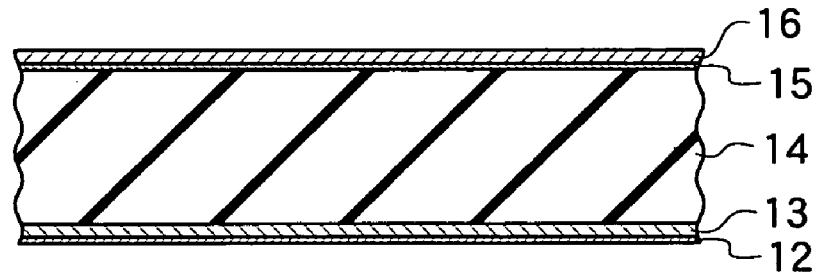

FIG. 1 is a flowchart showing a method of manufacturing a structure according to the first embodiment of the present invention. Further, FIGS. 2A–2C are diagrams for explanation of the method of manufacturing a structure according to this embodiment. In this embodiment, a laminated structure constructed by plural layers including a brittle material layer is manufactured. For example, a laminated structure using a dielectric material (ferroelectric material) as the brittle material and having electrodes formed on both sides thereof can be used for a capacitor or the like. Further, a laminated structure using a piezoelectric material such as PZT (Pb (lead) zirconate titanate) as the brittle material can be used for an ultrasonic transducer for transmitting and receiving ultrasonic waves in an ultrasonic imaging apparatus, a piezoelectric actuator, or the like.

At step S1 in FIG. 1, as shown in FIG. 2A, a substrate 10 is prepared and an intermediate layer 11 as a separating layer to be subsequently used for separating the substrate 10 from the laminated structure is formed on the substrate 10. As the substrate 10, silicon, glass, sapphire, alumina ($Al_2O_3$), SUS (special use steel), or the like can be used. As a material of the intermediate layer 11, thermally decomposable polymer decomposed by thermal oxidation can be used, and a resist material including polyimide, PMMA (poly methyl methacrylate), Novorak resins, ethyl cellosolve acetates, naphthoquinone diamide is applicable.

For example, a polyimide photoresist is applied onto the silicon plate 10 by using a spin coater while controlling the revolving speed to have a thickness of 0.5 micrometers. Further, the applied polyimide photoresist is dried by baking to form the intermediate layer 11.

At step S2, as shown in FIG. 2B, a laminated structure is formed by stacking layers 12–16 on the intermediate layer 11. That is, first, a two-layer electrode is formed by forming films of a titanium (Ti) layer 12 and a platinum (Pt) layer 13 by using the sputtering method. The titanium layer 12 is disposed for making platinum, which has relatively low adhesiveness to other materials, in close contact with the under layer, and has a thickness on the order of 10 nm to 100 nm, more preferably, 10 nm to 50 nm. The platinum layer 13 is a conductor layer to be used for applying a voltage to an upper layer 14, and has a thickness on the order of 50 nm to 150 nm.

Next, on the platinum layer 13, a PZT layer 14 is formed by using the AD method.

Figure 3:
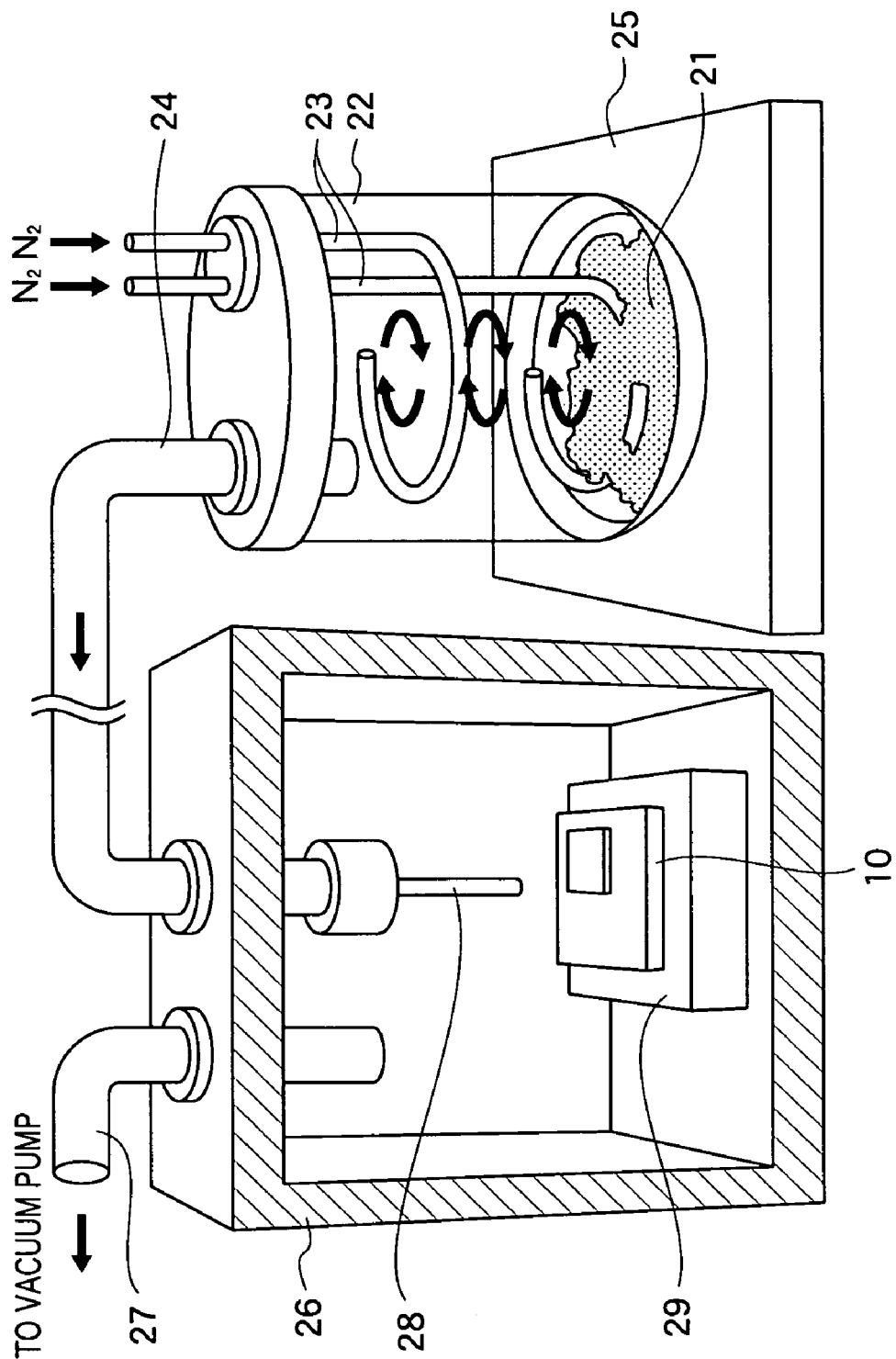
FIG. 3 is a schematic diagram showing a film forming apparatus according to the AD method.

FIG. 3 is a schematic diagram showing a film forming apparatus according to the AD method. The film forming apparatus has an aerosol generating container 22 in which raw material powder 21 (e.g., PZT monocrystal powder having an average particle diameter of 0.3 μm) is located. Here, the word "aerosol" refers to fine particles of solid or liquid floating in a gas. In the aerosol generating container 22, a carrier gas lead-in part 23, an aerosol lead-out part 24, and a vibrating part 25 are provided. By introducing a gas such as nitrogen gas ($N_2$) from the carrier gas lead-in part 23, the raw material powder located within the aerosol generating container 22 is blown up to generate an aerosol. At that time, by applying vibration to the aerosol generating container 22 by the vibrating part 25, the raw material powder is agitated so as to generate the aerosol efficiently. The generated aerosol is guided through the aerosol lead-out part 24 to a film forming chamber 26.

In the film forming chamber 26, an exhaust pipe 27, a nozzle 28, and a movable stage 29 are provided. The exhaust pipe 27 is connected to a vacuum pump and exhausts air from inside of the film forming chamber 26. The aerosol generated in the aerosol generating container 22 and guided through the aerosol lead-out part 24 to the film forming chamber 26 is sprayed from the nozzle 28 toward the substrate 10. Thereby, the raw material powder impinges on the substrate 10 and is deposited on the substrate 10. The substrate 10 is mounted on the movable stage 29 movable in a three-dimensional manner, and the relative position between the substrate 10 and the nozzle 28 is adjusted by controlling the movable stage 29.

Further, as shown in FIG. 2C, on the PZT layer 14, a titanium layer 15 and a platinum layer 16 are formed by using the sputtering method. Thereby, a structure of a vibrator having electrodes on both sides of a piezoelectric material is formed. Furthermore, a laminated structure having plural PZT layers may be formed by sequentially laminating the PZT layers, titanium layers and platinum layers in a desired times on the platinum layer 16.

As the layers 12 and 15 for bringing the platinum layers 13 and 16 in close contact with the under layers, in place of the titanium layers, titanium oxide ($TiO_2$) layers may be used. By using a material that has been oxidized in advance, change in quality of the material due to oxygen to be generated at the time of subsequent heat treatment or baking and transmitted through the PZT layer, and resulting deterioration in function as an adhesion layer can be prevented.

At step S3 in FIG. 1, at least a part of the intermediate layer 11 is removed by performing, for example, heat treatment in the air at 500° C. for about two hours to thermally oxidize and decompose the polyimide photoresist film. Thereby, the substrate 10 is separated from the laminated structure 12–16. Thus, the substrate can be separated easily without producing an excessive stress on the formed laminated structure. If necessary, the laminated structure 12–16 may be subjected to heat treatment afterwards.

Next, a thickness of each layer formed in this embodiment will be described in detail.

Figure 4:
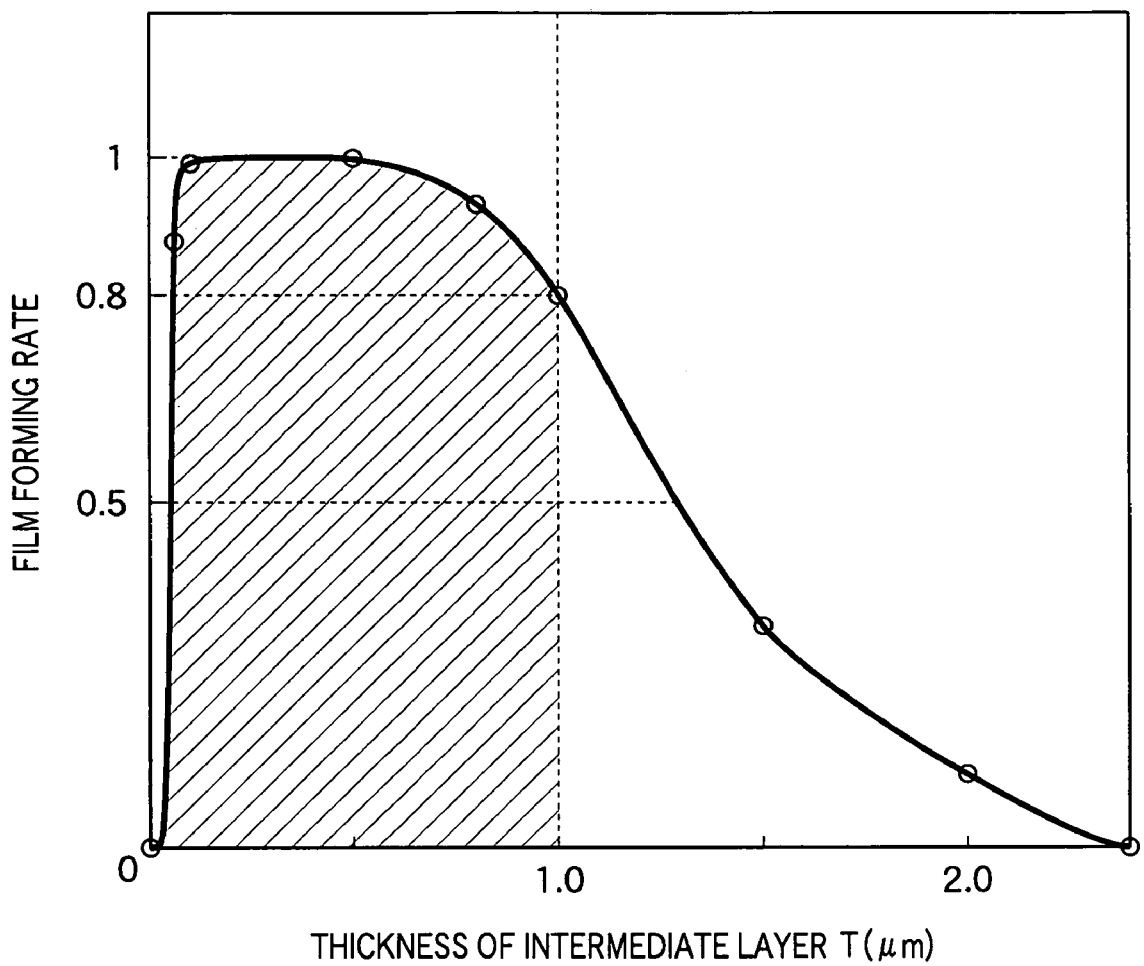
FIG. 4 shows a relationship between the thickness of an intermediate layer and the film forming rate of a PZT layer formed by using the AD method.

FIG. 4 shows a relationship between the thickness T ($\mu$m) of the intermediate layer and the film forming rate of the PZT layer formed by using the AD method. In FIG. 4, the vertical axis indicates a value obtained by normalizing the film forming rate with the film forming rate when the film formation is well performed as "1" and multiplying the normalized film forming rate by separability. Generally, the film forming rate is expressed by a film thickness to a unit amount of consumption of a raw material.

By providing the intermediate layer having a thickness within a predetermined range, it becomes possible to eliminate the interaction between the lowermost layer (the titanium layer 12 in FIG. 2B) of the structure and the substrate and separate them from each other. Here, in the range of $0 < T \leq 0.7$ $\mu$m, a good film forming rate is shown. Further, the film forming rate begins to fall gradually from the vicinity of the point where the thickness T is 0.7 $\mu$m, and in the vicinity of the point where the thickness T is 1.0 $\mu$m, the film forming rate becomes lower than 0.8. Furthermore, as the thickness T exceeds 1.0 $\mu$m, the film forming rate begins to fall drastically, and, as the thickness T exceeds 2.4 $\mu$m, the film formation by using the AD method becomes impossible.

Thus, the reason why the film forming rate falls as the thickness of the intermediate layer increases is as follows. The AD method is a film forming method for depositing raw material powder on the under layer by utilizing the collision energy generated when the raw material powder accelerated at high speed impinges on the under layer. Accordingly, if the elasticity (cushion property) of the under layer is too large, the collision energy of the raw material powder is absorbed or the powder bounces, and therefore, the powder cannot be deposited on the under layer.

Therefore, in this embodiment, the range of $0 < T \leq 2.4$ $\mu$m is defined as a range in which the film formation by the AD method can be performed and the formed structure can be separated from the substrate, and the range of $T \leq 1.0$ $\mu$m in which the film forming rate indicates 0.8 or more (the shaded region in FIG. 4) is defined as a range in which the film formation can be well performed.

Next, in this embodiment, the reason why the thickness of the platinum layer 13 is made 50 nm or more is as follows. In the AD method, the phenomenon that the raw material powder cuts into the under layer (the platinum layer 13 in FIG. 1) occurs, which phenomenon is referred to as "anchoring". The thickness of the anchor layer (the layer into which the powder cuts) produced by the anchoring is generally on the order of 10 nm to 100 nm, which differs according to the material of the under layer, the powder velocity and so on. Accordingly, in order to sufficiently produce anchoring so as to make the PZT layer in close contact with the platinum layer and allow the conductivity of the platinum to function well, it is desired that the thickness of the platinum layer is at least 50 nm. Further, the reason why the thickness of the platinum layer 13 is made 150 nm or less, as well as the intermediate layer, if the cushion property of the platinum layer is too large, the PZT layer becomes difficult to be deposited.

As described above, according to this embodiment, a substrate can be easily separated from a structure including a brittle material layer formed by using the AD method. Therefore, after a series of film forming steps including the formation of the electrode layer and brittle material layer, the process can be moved to the next step. Thus, the trouble for forming an electrode layer separately in the lowermost layer of the structure is not required. Further, since the electrode layer on which the brittle material layer is formed by using the AD method can be used without change after the substrate is separated, strong adhesion between the layers can be maintained. In this embodiment, the laminated structure in which the electrode layers are formed on both sides of the dielectric material layer is manufactured, however, a structure with a single layer of a brittle material layer only may be manufactured.

Next, a structure and a method of manufacturing the structure according to the second embodiment of the present invention will be described.

Figure 5:
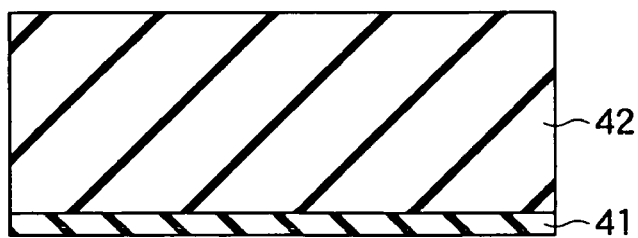
FIG. 5 is a sectional view showing a structure according to the second embodiment of the present invention.

FIG. 5 is a sectional view showing a structure according to the second embodiment of the present invention. The structure as shown in FIG. 5 includes an intermediate layer 41 of ceramic and a thick film layer 42 of ceramic having the same composition but different void ratios. The intermediate layer 41 has a void ratio within a range from 20% to 40%, and the thick film layer 42 has a void ratio of 5% or less. This structure can be used as a ceramic material as well as a general bulk material.

Figure 6:
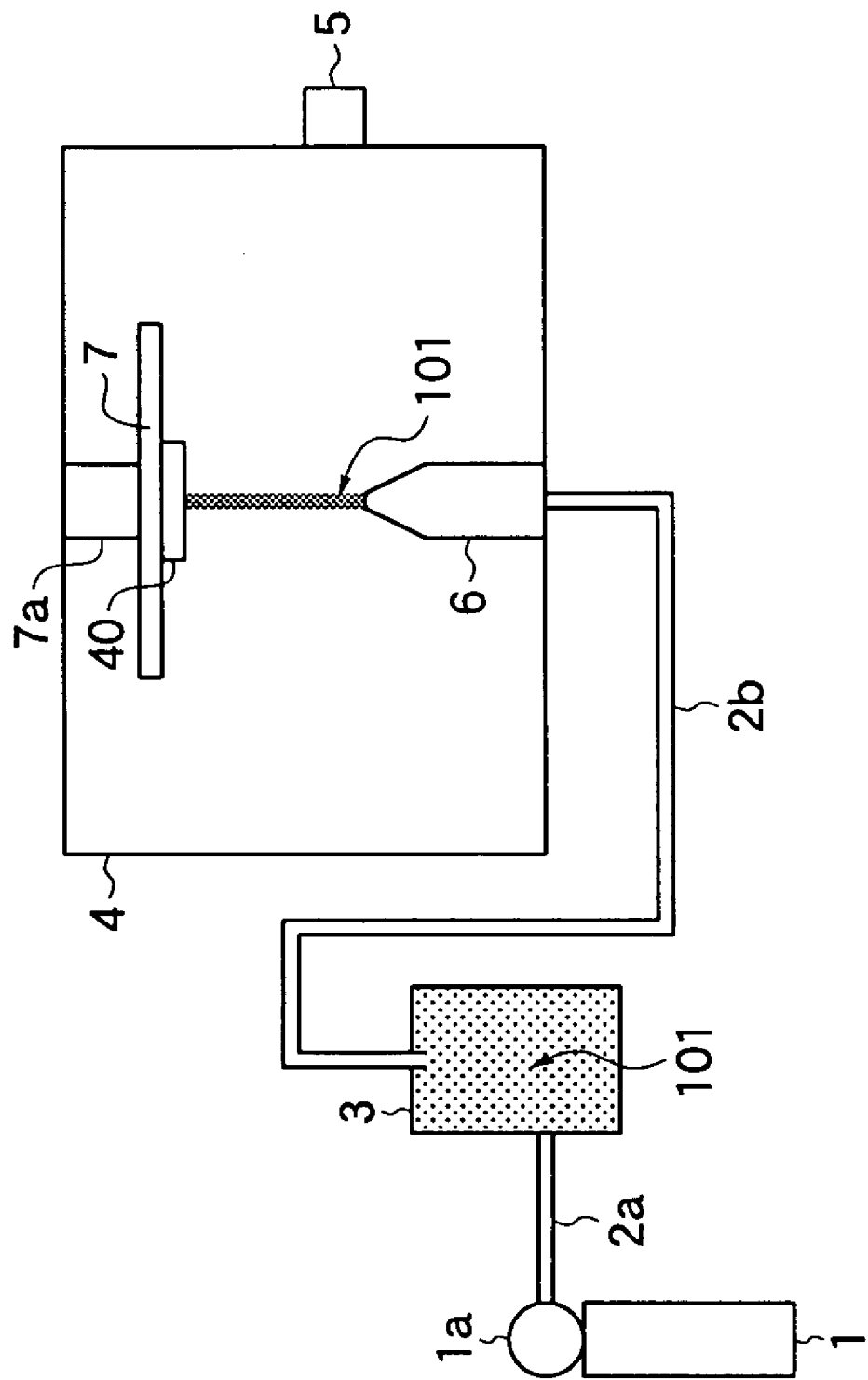
FIG. 6 is a schematic diagram showing another film forming apparatus according to the AD method.

When the structure as shown in FIG. 5 is manufactured, a film forming apparatus according to the AD method as shown in FIG. 6 is used. This film forming apparatus includes a compressed gas cylinder 1, carrier pipes 2a and 2b, an aerosol generating container 3, a film forming chamber 4, an exhaust pump 5, a nozzle 6, a substrate holder 7, and a substrate holder driving unit 7a.

The compressed gas cylinder 1 is filled with nitrogen ($N_2$), oxygen ($O_2$), helium (He), argon (Ar), dry air, or the like to be used as a carrier gas. In the compressed gas cylinder 1, a pressure regulating part 1a for regulating the supplied amount of the carrier gas is provided. Further, the aerosol generating container 3 is a container in which micro powder of a raw material as a film forming material is located. By introducing the carrier gas from the compressed gas cylinder 1 via the carrier pipe 2a to the aerosol generating container 3, the raw material powder located there is blown up to generate an aerosol 101. The generated aerosol 101 is supplied to the nozzle 6 via the carrier pipe 2b.

The air inside of the film forming chamber 4 is exhausted by the exhaust pump 5, and thereby, the inside is held at a predetermined degree of vacuum. Further, in the film forming chamber 4, the nozzle 6 for spraying the aerosol 101 and the substrate holder 7 for holding the substrate 10, on which the structure is to be formed, are placed. In the substrate holder 7, the substrate holder driving unit 7a for moving the substrate holder 7 in a three-dimensional manner is provided, and thereby, the relative position and the relative speed between the nozzle 6 and the substrate 10 are controlled.

Figure 7A:
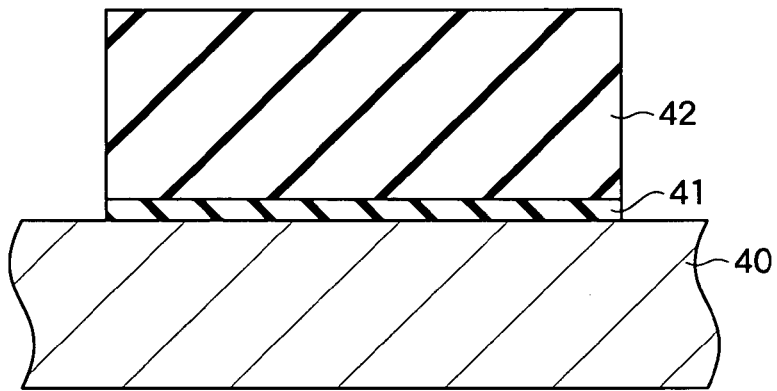
FIGS. 7A to 7C are diagrams for explanation of the method of manufacturing a structure according to the second embodiment of the present invention.
Figure 7B:
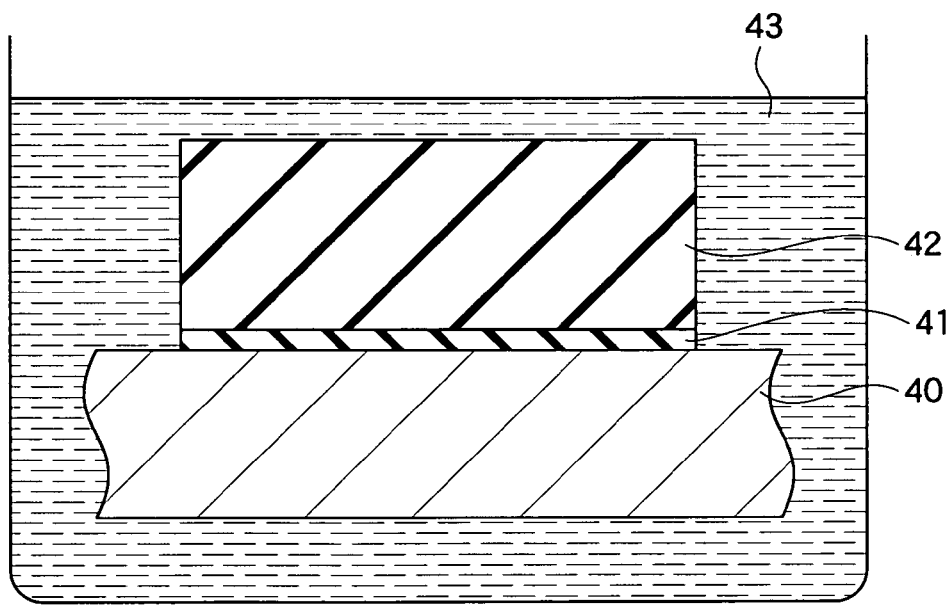
Figure 7C:
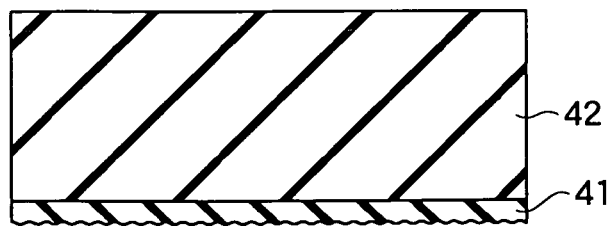

FIGS. 7A–7C are diagrams for explanation of a method of manufacturing the structure according to this embodiment.

First, as shown in FIG. 7A, the intermediate layer 41 and the thick film layer 42 are formed on a substrate 40. The substrate 40 is a base material which is used from the formation of the intermediate layer 41 and the thick film layer 42 to the subsequent manufacturing process. Although SUS (special use steel) is used as the substrate 40 in this embodiment, various materials other than that such as silicon, glass, or ceramic can be used.

In the film forming apparatus according to the AD method as shown in FIG. 6, the substrate 40 is placed and kept at predetermined film forming temperature (e.g., 600° C.). Then, by employing as raw material powder PZT powder having an average particle diameter adjusted such that the void ratio after film formation may become 20% to 40%, the intermediate layer 41 is formed on the substrate 40 by using the AD method. Further, by employing as raw material powder PZT powder having an average particle diameter adjusted such that the void ratio after film formation may become 5% or less, the thick film layer 42 is formed on the intermediate layer 41 by using the AD method.

Although both the intermediate layer 41 and the thick film layer 42 are ceramic layers having the same composition, the average crystal particle diameters in those layers are different from each other, and therefore, the void ratios are different from each other. As a result, their hardnesses are different from each other. Here, the void ratio represents a ratio of voids existing within a structure such as a ceramic layer, and is expressed by the following equation: void rate (%)=100%−filling rate (%). The filling rate represents a ratio of a volume, for which particles contained in a structure such as a ceramic layer actually account, to a volume of the entire structure.

The thick film layer 42 is a PZT (Pb (lead) zirconate titanate) thick film having a thickness on the order of 100 μm. Further, the void ratio of the thick film layer 42 is 5% or less. The PZT thick film is provided with electrodes on both sides thereof to be used for a piezoelectric actuator, a piezoelectric pump, an ink head of an inkjet printer, an ultrasonic transducer and so on.

On the other hand, the intermediate layer 41 is a PZT thin film having a thickness on the order of 10 μm. Further, the void ratio of the intermediate layer 41 is 20% to 40%, which is higher compared with the void ratio of the thick film layer 42. As a result, the hardness of the intermediate layer 41 is lower than the hardness of the thick film layer 42. By providing such intermediate layer 41 between the thick film layer 42 and the substrate 40, it becomes easier at the intermediate layer 41 to separate the substrate 40 from the thick film layer 42.

Here, a method and a principle of varying the void ratios of the intermediate layer 41 and the thick film layer 42 both having the same composition will be described in detail.

In the AD method, it is known that differences are produced in the quality of formed films, deposition ratios, or the like depending on various conditions with respect to the powder sprayed from the nozzle. For example, raw material powder (primary particles) located in the aerosol generating container is agglomerated by the electrostatic force, Van der Waals force, or cross-link effect of water as time passes and form secondary agglomerated particles. If such secondary particles impinge on the substrate, the secondary particles use its kinetic energy for crushing themselves, and therefore, the secondary particles never adhere to the under layer. Accordingly, the secondary particles cannot contribute to the film formation, and, in some cases, they blast the deposited material that has been previously formed. Further, it is empirically known that, even if the sprayed powder is primary particles, a range of the average particle diameter suitable for film formation exists.

Therefore, the inventor of the present invention has focused attention on the average particle diameter of the raw material powder and investigated a relationship between the average particle diameter and the quality of the AD film. That is, the inventor of the present invention has formed AD films by using the film forming apparatus as shown in FIG. 6 while varying the average particle diameter of the PZT powder in the range of 0.2 μm to 0.3 μm, and observed the surface of each AD film and measured the hardness thereof. As a result, it has been found that there is a certain relationship between the average particle diameter of the raw material powder and the quality of the AD film.

First, when the surface of the formed AD film is observed by using an SEM (scanning electron microscope), the larger the average particle diameter of the PZT powder as the raw material is (e.g., 0.3 μm), the smaller the average crystal particle diameter becomes and the lower the void ratio in the AD film becomes (e.g., 5% or less). On the contrary, the smaller the average particle diameter of the PZT powder of the raw material is (e.g., 0.2 μm), the larger the average crystal particle diameter becomes and the higher the void ratio in the AD film becomes (e.g., 10% or more).

Figure 8:
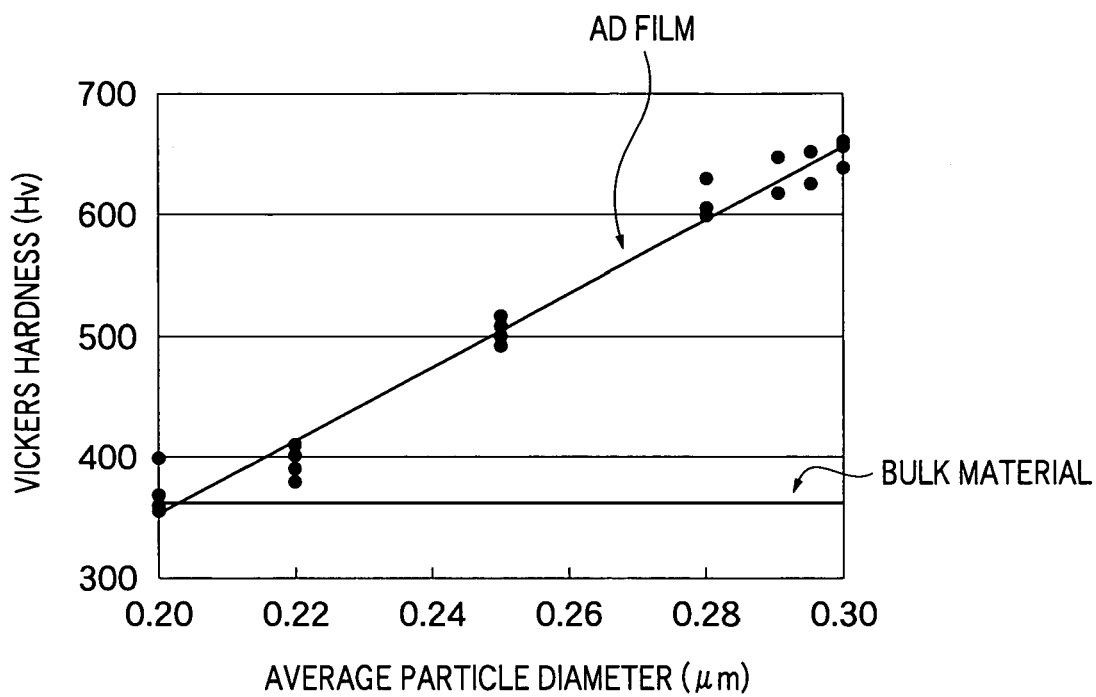
FIG. 8 shows a relationship between the average crystal particle diameter of PZT powder as a raw material and Vickers hardness of the AD film.

FIG. 8 shows a relationship between the average particle diameter (μm) of the PZT powder as the raw material and Vickers hardness (Hv) of the AD film. As shown in FIG. 8, in the range where the average particle diameter of the PZT powder as the raw material is from 0.2 μm to 0.3 μm, the larger the average particle diameter, the larger the Vickers hardness of the formed AD film, while, the smaller the average particle diameter, the smaller the Vickers hardness of the formed AD film. In FIG. 8, the Vickers hardness of a PZT bulk material is also shown for comparison.

It is thought that these observation results and measurement results are produced by the following mechanism. That is, since a primary particle having a large particle diameter has large kinetic energy when it is sprayed from the nozzle, the particle is easy to be crushed when it impinges on the substrate. Accordingly, fragments of the finely crashed primary particle are coupled to each other by the mechanochemical reaction, and thereby, a dense and strong AD film is formed. On the other hand, since a primary particle having a small particle diameter has small kinetic energy, the particle is difficult to be crushed when it impinges on the substrate. Such a primary particle is only trapped (captured) by the under layer to be deposited thereon even when it impinges on the substrate, and therefore, forms a film having a low void ratio and being relatively brittle.

Accordingly, by defining the average particle diameter of the raw material powder based on the above mechanism, the average crystal particle diameter, the void ratio, and the hardness of the AD film can be controlled.

In this embodiment, when the intermediate layer 41 and the thick film layer 42 are formed, two kinds of PZT powder having different average particle diameters from each other are used. For example, when the thick film layer 42 is formed, PZT powder having an average particle diameter of substantially 0.3 μm to substantially 0.4 μm is used, and when the intermediate layer 41 is formed, PZT powder having a smaller average particle diameter of substantially 0.1 μm to substantially 0.2 μm is used. Thereby, compared with the thick film layer 42, the intermediate layer 41 can be formed with larger average crystal particle diameter and larger void ratio and lower hardness.

In order to obtain PZT powder having a predetermined average particle diameter, as one method, two or more kinds of ready-made PZT fine powder having different center values of particle diameter distribution may be mixed. For example, by employing PZT fine powder having a central value of particle diameter distribution of 0.1 μm to 0.5 μm as a smaller one and PZT fine powder having a central value of particle diameter distribution of 0.2 μm to 0.6 μm as a larger one, those are mixed at a predetermined ratio. More preferably, by employing PZT fine powder having a central value of particle diameter distribution of 0.1 µm to 0.2 µm as a smaller one and PZT fine powder having a central value of particle diameter distribution of 0.3 µm to 0.4 µm as a larger one, those are mixed at a predetermined ratio.

Figure 9:
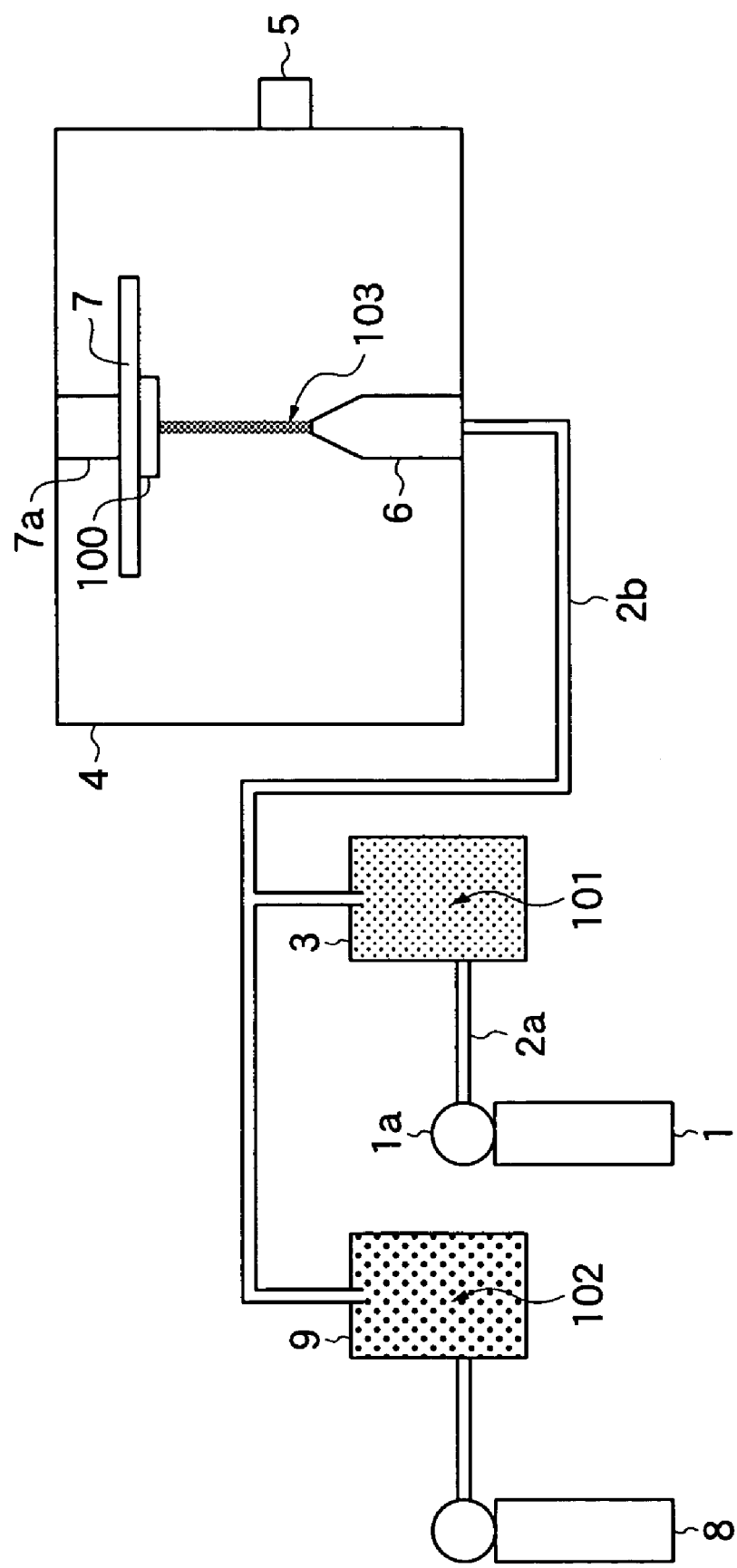
FIG. 9 is a schematic diagram showing yet another film forming apparatus according to the AD method.

In the above-described second embodiment of the present invention, the aerosol is generated by employing raw material powder in which the average particle diameter has been adjusted in advance. However, the aerosol containing powder having a desired average particle diameter may be generated by mixing plural kinds of aerosols. For this purpose, a film forming apparatus according to the AD method as shown in FIG. 9 is used. This film forming apparatus further includes a compressed gas cylinder 8 and a carrier gas generating chamber 9 in addition to the film forming apparatus as shown in FIG. 6. Other construction is the same as in the film forming apparatus as shown in FIG. 6.

As shown in FIG. 9, in the aerosol generating containers 3 and 9, aerosols 101 and 102 are generated, respectively. Those aerosols 101 and 102 are mixed during carriage in the carrier pipe 2b. At that time, by controlling the flow rates of carrier gases supplied from the compressed gas cylinders 1 and 8, respectively, the mixing ratio of the aerosol 101 and the aerosol 102 can be adjusted. Thereby, the average particle diameter of the raw material powder contained in an aerosol 103 to be sprayed from the nozzle 6 can be adjusted.

When the structure as shown in FIG. 5 is manufactured, smaller PZT fine powder (e.g., the central value of particle diameter distribution is within the range from 0.1 µm to 0.5 µm) is placed in one aerosol generating container 3, and larger PZT fine powder (e.g., the central value of particle diameter distribution is within the range from 0.2 µm to 0.6 µm) is placed in the other aerosol generating container 9. Then, the film formation of the intermediate layer 41 is performed while adjusting the supplied amounts of carrier gases such that the aerosol 101 and the aerosol 102 may be supplied at a predetermined ratio. Then, the supply of the aerosol 101 is stopped, and film formation of the thick film layer 42 is performed by employing the aerosol 102 only.

By using such a film forming apparatus, an aerosol containing powder having a desired average particle diameter can be generated easier, and, because there is no need to replace the raw material powder placed in the aerosol generating container at each time when film formation of a different layer is performed, the trouble can be saved.

Although the structure according to the second embodiment of the present invention is thus manufactured, further, such a structure may be annealed at predetermined temperature. Thereby, the particle diameter of the PZT crystal contained in the thick film layer 42 can be made larger so as to improve the piezoelectric characteristics. By annealing, the average crystal particle diameters in the intermediate layer 41 and the thick film layer 42 change from the average crystal particle diameters immediately after the film formation, however, they cannot exceed 500 nm in both layers.

Next, as shown in FIG. 7B, by chemically etching the substrate 40 on which the intermediate layer 41 and the thick film layer 42 are formed, the substrate 40 is selectively removed. As an etching solution 43, for example, an iron (II) chloride solution ($FeCl_3$) at normal temperature for solving the SUS substrate is used. Thereby, as shown in FIG. 7C, the structure, from which the substrate 40 has been removed, is obtained.

Thus, the structure according to this embodiment includes not only the thick film layer 42 but also the intermediate layer 41 to be used as a separating layer. Since the structure is formed by forming a film on the intermediate layer 41, and then, the substrate 40 is removed, the substrate 40 can be removed easily without damaging the structure. For this purpose, as a technique for removing the substrate 40, various techniques as described above can be used. Further, if necessary, the lower part of the intermediate layer 41 as shown in FIG. 7C may be ground smooth. Furthermore, before or after that, the structure may be annealed at a predetermined temperature.

Next, a modified example of the method of manufacturing the structure according to the second embodiment of the present invention will be described.

When the substrate 40 is removed from the intermediate layer 41 and the thick film layer 42, the substrate 40 may be separated by heat treatment instead of using the etching solution as shown in FIG. 6C. That is, the structure after film formation as shown in FIG. 7A is heated to higher temperature (e.g., about 700° C.) than the film forming temperature. Thereby, thermal stress is produced at the boundary between the substrate 40 and the thick film layer 42, a fracture is produced in the intermediate layer 41 having the lowest hardness and the substrate 40 is separated. Furthermore, by grinding the fractured surface smooth, the structure as shown in FIG. 5 is obtained. Thus, according to this embodiment, the substrate 40 can be separated without producing cracking in the thick film layer 42.

Next, a modified example of the structure according to the second embodiment of the present invention will be described.

Figure 10:
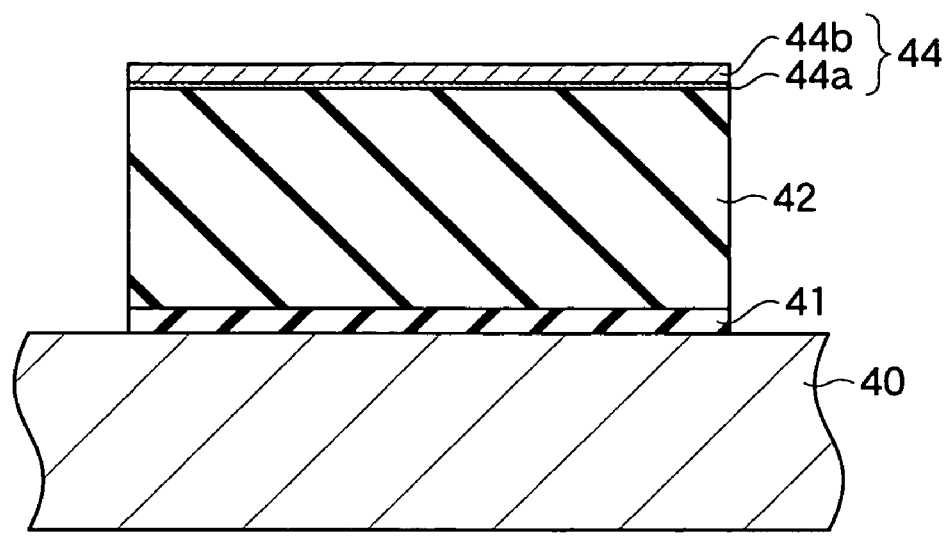
FIG. 10 is a sectional view showing a modified example of the structure according to the second embodiment of the present invention.

FIG. 10 is a sectional view showing the modified example of the structure according to the second embodiment of the present invention. This structure includes the substrate 40, the intermediate layer 41, the thick film layer 42, and an upper electrode 44. The upper electrode 44 is a two-layer electrode including a titanium oxide ($TiO_2$) layer 44a of substantially 20 nm, and a platinum layer 44b of substantially 200 nm. The titanium oxide layer 44a is provided for bringing the thick film layer 42 in close contact with the platinum layer 44b. A laminated structure may be formed by further alternately laminating plural PZT thick films and plural electrodes on the upper electrode 44. In this case, the manufactured structure becomes easier to be applied to an application such as a piezoelectric actuator.

In the second embodiment of the present invention, PZT is used as ceramic, however, the present invention can be applied to any ceramic of oxide ceramics including alumina ($Al_2O_3$) and titanium oxide ($TiO_2$), and non-oxide ceramics including carbide ceramics such as silicon carbide (SiC), nitride ceramics such as silicon nitride ($Si_3N_4$) and boride ceramics such as titanium boride ($TiB_2$). In the case where the present invention is applied to ceramic other than PZT, it is thought that a range of an average particle diameter of the powder that can be used as a raw material for the AD method, and a relationship between the average particle diameter and the void ratio or hardness are different from those in the case of PZT. Therefore, it is desired that those relationships have been measured in advance in accordance with materials to be used.

The invention claimed is:

1. A method of manufacturing a structure comprising the steps of:
    (a) forming an intermediate layer on a substrate;
    (b) forming a structure including a brittle material layer on said intermediate layer by at least using a spray deposition method of spraying material powder toward said substrate, on which said intermediate layer is formed, to deposit the material powder; and
    (c) separating said substrate from said structure, wherein:

step (a) includes forming the intermediate layer having a void ratio higher than that of said brittle material layer by generating an aerosol containing ceramic powder having a first average particle diameter and spraying the aerosol toward said substrate to deposit the ceramic powder; and step (b) includes forming said brittle material layer by generating an aerosol containing ceramic powder having a second average particle diameter larger than said first average particle diameter and spraying the aerosol toward said substrate to deposit the ceramic powder.

2. The method of manufacturing a structure according to claim 1, wherein:

said intermediate layer contains first ceramic having a first average crystal particle diameter; and said brittle material layer contains second ceramic having the same composition as that of said first ceramic and a second average crystal particle diameter smaller than said first average crystal particle diameter.

3. The method of manufacturing a structure according to claim 2, wherein Vickers hardness of said first ceramic is smaller than Vickers hardness of said second ceramic.

4. The method of manufacturing a structure according to claim 1, further comprising the step of:

preparing ceramic powder having one of said first average particle diameter and said second average particle diameter by mixing plural kinds of ceramic powder having different center values of particle diameter distributions from each other at a predetermined ratio.

5. The method of manufacturing a structure according to claim 1, wherein at least one of step (a) and step (b) includes generating plural kinds of aerosol containing ceramic powder having different center values of particle diameter distributions from each other, and mixing the plural kinds of aerosol at a predetermined ratio.

6. The method of manufacturing a structure according to claim 1, wherein step (c) includes separating said substrate from said structure by immersing said substrate, on which said intermediate layer and said structure are formed, in a chemical solution.

7. The method of manufacturing a structure according to claim 1, wherein step (c) includes separating said substrate from said structure by heat treating said substrate, on which said intermediate layer and said structure are formed, at higher temperature than temperature at which said intermediate layer is formed.

* * * * *